United States Patent
Park et al.

(10) Patent No.: US 9,543,200 B2
(45) Date of Patent: Jan. 10, 2017

(54) METHODS FOR FABRICATING SEMICONDUCTOR DEVICES HAVING THROUGH ELECTRODES

(71) Applicant: Samsung Electronics Co., Ltd., Suwon-si (KR)

(72) Inventors: Kunsang Park, Hwaseong-si (KR); Sukyoung Kim, Suwon-si (KR); Jisoon Park, Suwon-si (KR); Ju-Il Choi, Suwon-si (KR); Byung Lyul Park, Seoul (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/183,817

(22) Filed: Feb. 19, 2014

(65) Prior Publication Data
US 2014/0235052 A1    Aug. 21, 2014

(30) Foreign Application Priority Data

Feb. 21, 2013  (KR) .................. 10-2013-0018704

(51) Int. Cl.
*H01L 21/768*    (2006.01)

(52) U.S. Cl.
CPC ... *H01L 21/76864* (2013.01); *H01L 21/76873* (2013.01); *H01L 21/76898* (2013.01)

(58) Field of Classification Search
USPC .......... 257/762, E21.333, E21.585; 427/250, 427/248.1; 438/197, 637
See application file for complete search history.

(56) References Cited

U.S. PATENT DOCUMENTS

| | | | |
|---|---|---|---|
| 5,091,768 A * | 2/1992 | Yamazaki | ............ 257/758 |
| 6,475,903 B1 | 11/2002 | Gardner | |
| 6,873,054 B2 | 3/2005 | Miyazawa et al. | |
| 7,312,148 B2 | 12/2007 | Ramaswamy et al. | |
| 7,419,906 B2 | 9/2008 | Kato | |
| 7,704,879 B2 | 4/2010 | Suzuki | |

(Continued)

FOREIGN PATENT DOCUMENTS

| | | |
|---|---|---|
| JP | 2004296854 | 10/2004 |
| JP | 2006012889 | 1/2006 |

(Continued)

OTHER PUBLICATIONS

Lu et al. "Trench filling by ionized metal physical vapor deposition," 2001, J. Vac. Sci. Technol. A, 19(5), pp. 2652-2663.*

*Primary Examiner* — Kimberly Rizkallah
*Assistant Examiner* — Bo Bin Jang
(74) *Attorney, Agent, or Firm* — Myers Bigel, P.A.

(57) ABSTRACT

Methods for fabricating semiconductor devices having through electrodes are provided. The method may comprise forming a via hole which opens towards an upper surface of a substrate and disconnects with a lower surface of the substrate; forming a via isolation layer which extends along an inner surface of the via hole and covers the upper surface of the substrate; forming a seed layer on the via isolation layer which extends along the via isolation layer; annealing the seed layer in-situ after forming the seed layer; forming a conductive layer, filling the via hole, by an electroplating using the seed layer; and planarizing the upper surface of the substrate to form a through electrode surrounded by the via isolation layer in the via hole.

15 Claims, 22 Drawing Sheets

(56) References Cited

U.S. PATENT DOCUMENTS

| | | | |
|---|---|---|---|
| 7,749,901 B2 | 7/2010 | Onodera et al. | |
| 8,049,327 B2 | 11/2011 | Kuo et al. | |
| 8,247,030 B2 | 8/2012 | Suzuki et al. | |
| 8,278,213 B2 | 10/2012 | Kameyama et al. | |
| 2004/0238927 A1* | 12/2004 | Miyazawa | 257/678 |
| 2004/0265482 A1* | 12/2004 | Horikawa | H01L 21/486 427/96.1 |
| 2006/0249849 A1* | 11/2006 | Cohen | 257/758 |
| 2007/0032004 A1* | 2/2007 | Ramaswamy et al. | 438/197 |
| 2008/0160655 A1 | 7/2008 | Hong | |
| 2009/0226611 A1* | 9/2009 | Suzuki et al. | 427/250 |
| 2009/0315154 A1* | 12/2009 | Kirby | H01L 21/743 257/621 |
| 2011/0256711 A1* | 10/2011 | Borthakur | 438/637 |

FOREIGN PATENT DOCUMENTS

| | | |
|---|---|---|
| JP | 2007053149 | 3/2007 |
| JP | 2008085238 | 4/2008 |
| KR | 10-2011-0075390 A | 7/2011 |

* cited by examiner

METHODS FOR FABRICATING SEMICONDUCTOR DEVICES HAVING THROUGH ELECTRODES

CROSS-REFERENCE TO RELATED APPLICATION

This application claims priority under 35 U.S.C. §119 to Korean Patent Application 10-2013-0018704 filed on Feb. 21, 2013 in the Korean Intellectual Property Office, the entire contents of which are hereby incorporated by reference.

FIELD

The present inventive concept relates to semiconductors and, more particularly, to methods for fabricating semiconductor devices having through electrodes.

BACKGROUND

A semiconductor device may be electrically connected to another semiconductor device or a printed circuit board using a through electrode, i.e., TSV, which penetrates the substrate. The through electrode can be used to create a 3D package capable of an enhanced electrical transmission speed compared to packages with a solder ball or solder bump.

SUMMARY

According to an exemplary embodiment of the present inventive concept, there is provided a method for fabricating a semiconductor device with a through electrode. A via hole may be formed which opens towards an upper surface of a substrate and does not penetrate a lower surface of the substrate. A via isolation layer may be formed which extends along an inner surface of the via hole and covers the upper surface of the substrate. A seed layer may be formed on the via isolation layer which extends along the via isolation layer. The seed layer may be annealed in-situ. A conductive layer which fills the via hole may be formed by an electroplating process using the seed layer. The upper surface of the substrate may be planarized to form a through electrode surrounded by the via isolation layer in the via hole.

The seed layer may be formed by physical vapor deposition to form a metal layer having an uneven thickness on the via isolation layer where the seed layer has a first thickness at an entrance of the via hole adjacent to the upper surface of the substrate and a second thickness less than the first thickness at a floor of the via hole adjacent to the lower surface of the substrate. The surface of the first thickness may be rougher than the surface of the second thickness. The annealing process may include reflowing the seed layer to reduce at least one of the first surface roughness and the second surface roughness.

A barrier layer which extends along the via isolation layer may be formed before forming the seed layer.

The lower surface of the substrate may be recessed to allow the through electrode to protrude. A lower insulation layer may be formed to cover the through electrode on the recessed lower surface of the substrate. The lower insulation layer may be planarized to expose the through electrode. An integrated circuit and a first metal line may be formed on the upper surface of the substrate which are electrically connected to the through electrode. An upper terminal and a second metal line may be formed on the upper surface of the substrate which are electrically connected to the through electrode. A lower terminal may be formed on the lower insulation layer which is electrically connected to the through electrode.

According to other embodiments of the inventive concept, there is provided a method for fabricating a semiconductor device including a substrate having an upper surface and a lower surface opposite to the upper surface. A via hole may be formed which partially penetrates the substrate and opens towards the upper surface of the substrate. A via isolation layer may be formed to cover an inner surface of the via hole. A metal layer may be formed by a physical vapor deposition to cover the via isolation layer. The metal layer may be annealed in-situ. A through electrode may be formed to fill the via hole by an electroplating process using the metal layer.

The surface of the metal layer at a floor of the via hole adjacent to the lower surface of the substrate may be smoother than the surface of the metal layer at an entrance of the via hole adjacent to the upper surface of the substrate. The portion of the metal layer at the floor of the via hole adjacent to the lower surface of the substrate may be thinner than the portion of the metal layer at an entrance of the via hole adjacent to the upper surface of the substrate.

The metal line may include copper and the in-situ annealing process may be performed at a temperature of about 150° C. to 350° C. The in-situ annealing process may be performed under a pressure less than an atmospheric pressure.

A barrier layer may be formed between the via isolation layer and the metal line.

The via hole may be formed through a dry etching process on the substrate to form a hole partially penetrating the substrate. This may result in the entrance of the via hole having an inclined surface including a downward slope toward the lower surface of the substrate.

According to other embodiments of the inventive concept, there is provided a method of fabricating a semiconductor device. A via hole may be formed partially penetrating a substrate with an entrance on the top surface of the substrate. An insulation layer may be formed to cover the inner surface of the via hole. A seed layer may be formed using a physical vapor deposition (PVD) process to cover the insulation layer. The seed layer may be annealed in-situ under a pressure less than an atmospheric pressure without a vacuum break relative to forming the seed layer. A through electrode may be formed to fill the via hole provided with the insulation layer and seed layer. The bottom surface of the substrate may be recessed to expose the through electrode.

A metal layer may be formed between the insulation layer and the seed layer.

The annealing may be performed at a temperature which is high enough to reflow the seed layer but low enough that the seed layer is not aggregated. The temperature may be about 150° C. to 350° C.

The seed layer may include copper and the annealing may be performed at a temperature of about 150° C. to 250° C. and for a duration of about 1 to 20 minutes.

The through electrode may be electrically attached to an integrated circuit on the top surface of the substrate and electrically connected to a lower terminal on the bottom surface of the substrate.

DETAILED DESCRIPTION OF PREFERRED EMBODIMENTS

Figure 1:
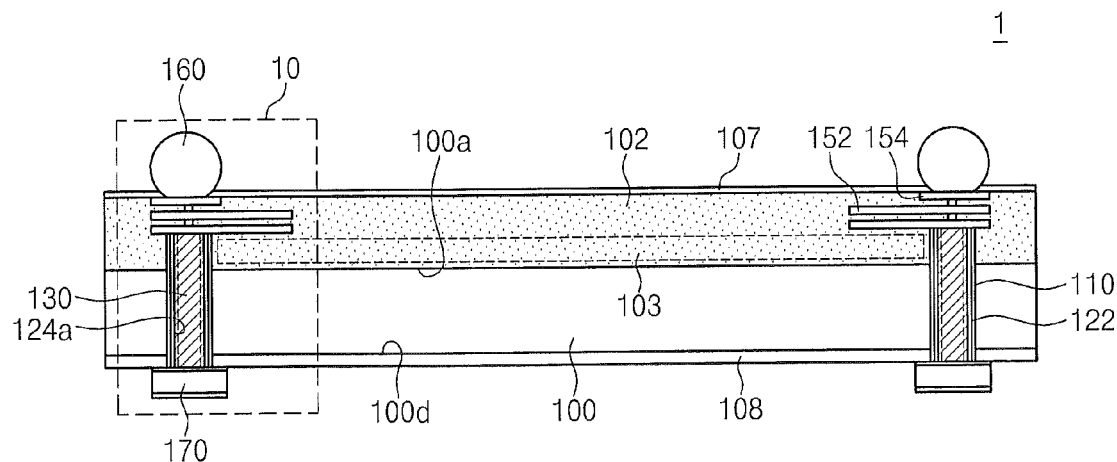
FIG. 1 is a cross sectional view illustrating a semiconductor device according to exemplary embodiments of the present inventive concept.

Embodiments will be described in detail with reference to the accompanying drawings. The inventive concept may, however, be embodied in various different forms and should not be construed as being limited to the embodiments set forth herein. Rather, these embodiments are provided as examples so that this disclosure will be thorough and complete and will fully convey the concept of the inventive concept to those skilled in the art. In the drawings, the thickness of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

FIG. 1 is a cross sectional view illustrating a semiconductor device according to exemplary embodiments of the present inventive concept.

Referring to FIG. 1, a semiconductor device 1 may comprise an electrical connection 10 delivering an electrical signal vertically passing through a substrate 100. The electrical connection 10 may comprise a through electrode 130 which vertically penetrates the substrate 100. A via isolation layer 110 may be provided between the through electrode 130 and the substrate 100 to electrically isolate the through electrode 130 from the substrate 100. A barrier layer 122 may be further provided between the through electrode 130 and the via isolation layer 110 to prevent constituent elements (e.g., copper) of the through electrode 130 from being diffused toward the substrate 100.

The through electrode 130 may be formed by depositing a seed layer 124a on either the via isolation layer 110 or the barrier layer 122 and performing an electroplating process using the seed layer 124a. According to some embodiments, after formation of the seed layer 124a, an annealing process may be performed in-situ to reduce a surface roughness of the seed layer 124a. Due to the in-situ annealing process, it may be possible to prevent or reduce the delamination (or detachment) of the through electrode 130 from the barrier layer 122.

The semiconductor device 1 may further comprise at least one of an upper terminal 160 and a lower terminal 170, which are electrically connected to the through electrode 130. The upper terminal 160 may be disposed on an active surface 100a of the substrate 100 and the lower terminal 170 may be disposed on an inactive surface 100d of the substrate 100. Each of the upper terminal 160 and the lower terminal 170 may include at least one of a solder ball, a solder bump, a redistribution pad, a pad, and so forth. For example, the upper terminal 160 may include a solder ball and the lower terminal 170 may include a pad.

An integrated circuit 103, a metal line 152, and an interlayer insulation layer 102 may be disposed on the active surface 100a of the substrate 100. The metal line 152 may be electrically connected to the integrated circuit 103 and have a single-layered or multi-layered structure. The interlayer insulation layer 102 may cover the integrated circuit 103 and the metal line 152. An upper insulation layer 107 may be disposed on the interlayer insulation layer 102 to open a bonding pad 154 which is electrically connected to the upper terminal 160. The through electrode 130 may be electrically connected to integrated circuit 103 through the metal line 152. The through electrode 130 may be disposed around or in the integrated circuit 103. A lower insulation layer 108 may be disposed on the inactive surface 100d of the substrate 100.

FIGS. 2A to 2K are cross sectional views illustrating a method for fabricating a semiconductor device according to exemplary embodiments of the present inventive concept.

Figure 2A:
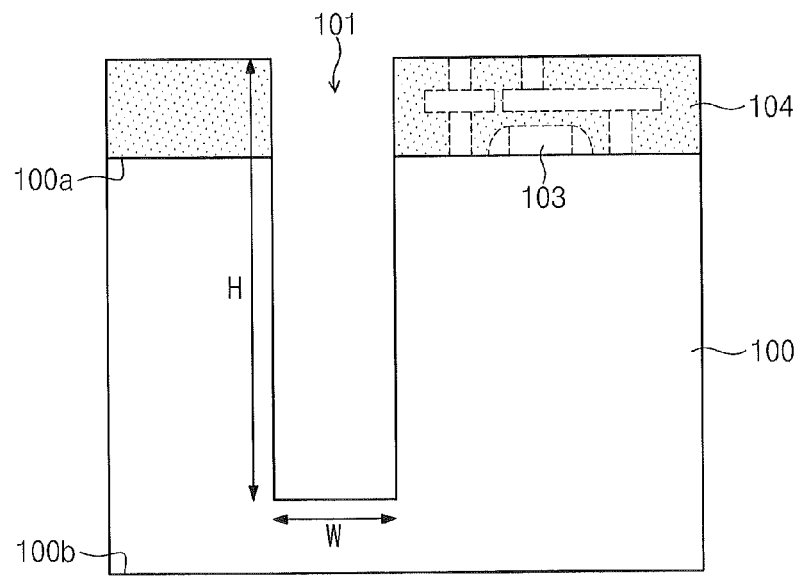
FIGS. 2A to 2K are cross sectional views illustrating a method for fabricating a semiconductor device according to exemplary embodiments of the present inventive concept.

Referring to FIG. 2A, a via hole 101 may be formed on the substrate 100. The substrate 100 may be a semiconductor substrate (for example, a silicon substrate) having an active surface 100a on which the integrated circuit 103 is provided and a first bottom surface 100b opposite the active surface 100a. A first interlayer insulation layer 104 may be formed on the active surface 100a of the substrate 100 to cover the integrated circuit 103. The integrated circuit 103 may be configured to include a memory circuit, a logic circuit, or a combination thereof. The first interlayer insulation layer 104 may be formed by depositing a silicon oxide layer or a silicon nitride layer. The via hole 101 may be formed to have a hollow pillar shape having an entrance near the active surface 100a of the substrate 100 but having such a depth as not to penetrate the first bottom surface 100b of the substrate 100. The via hole 101 may extend from the active surface 100a toward the first bottom surface 100b in a substantially vertical direction. The via hole 101 may be formed by performing a dry etching process on the first interlayer insulation layer 104 and the substrate 100. In some embodiments, the via hole 101 may be formed near the integrated circuit 103 (for example, a scribe lane or a region adjacent thereto) or may be formed near the integrated circuit 103. The via hole 101 may have an aspect ratio of about 10:1 (i.e., height H and width W where H=10 W) or more (i.e., H>10 W). For example, the via hole 101 may have the width W of several micrometers and the height H of about tens of micrometers.

Figure 2B:
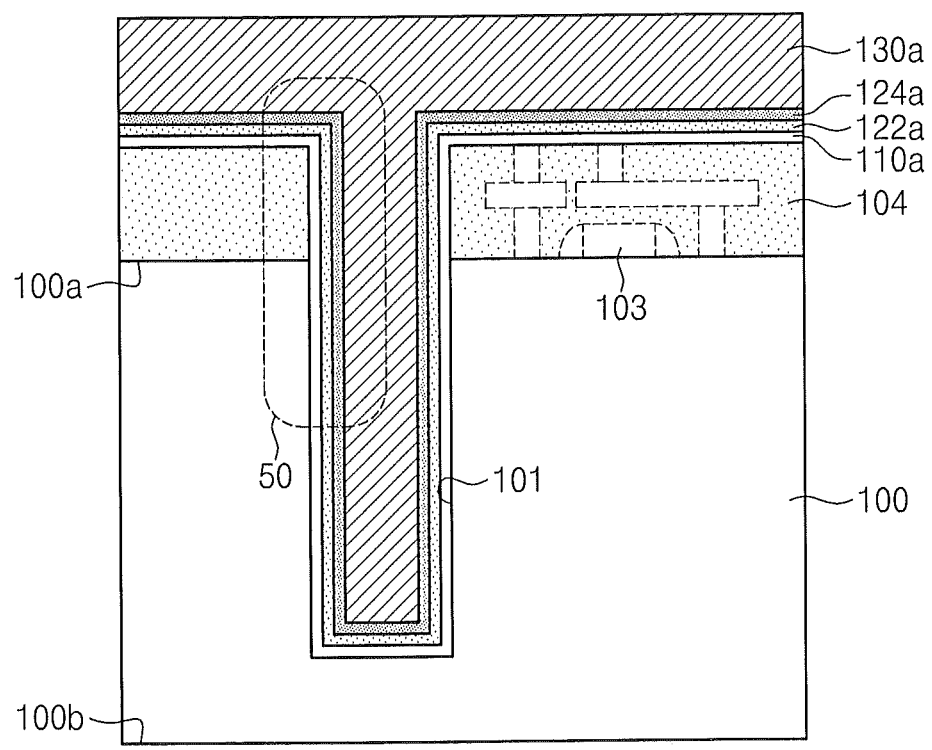

Referring to FIG. 2B, an insulation layer 110a may be formed to extend along an inner surface of the via hole 101, and then a conductive layer 130a may be formed on the substrate 100 to fill the via hole 101. The insulation layer 110a may be formed by depositing a silicon oxide layer or a silicon nitride layer. The conductive layer 130a may be formed by depositing or plating a layer of poly-silicon, copper, tungsten, aluminum, and so forth. If the conductive layer 130a is formed of a copper layer or a copper-containing conductive layer, a metal layer 122a capable of preventing copper diffusion may be further formed on the insulation layer 110a. The metal layer 122a may be formed to extend along the insulation layer 110a by depositing titanium (Ti), titanium nitride (TiN), chromium (Cr), tantalum (Ta), tantalum nitride (TaN), nickel (Ni), tungsten (W), tungsten nitride (WN), or any combination thereof.

According to some embodiments, the conductive layer 130a may be formed by electroplating a copper layer. For example, a seed layer 124a may be formed on the insulation layer 110a or the metal layer 122a, and the conductive layer 130a may be formed by an electroplating process using the seed layer 124a. The seed layer 124a may be formed by depositing a metal layer. The seed layer 124a may be formed to have an uneven thickness. An example is shown in FIG. 2C which is a magnified view of a portion 50 of FIG. 2B.

Figure 2C:
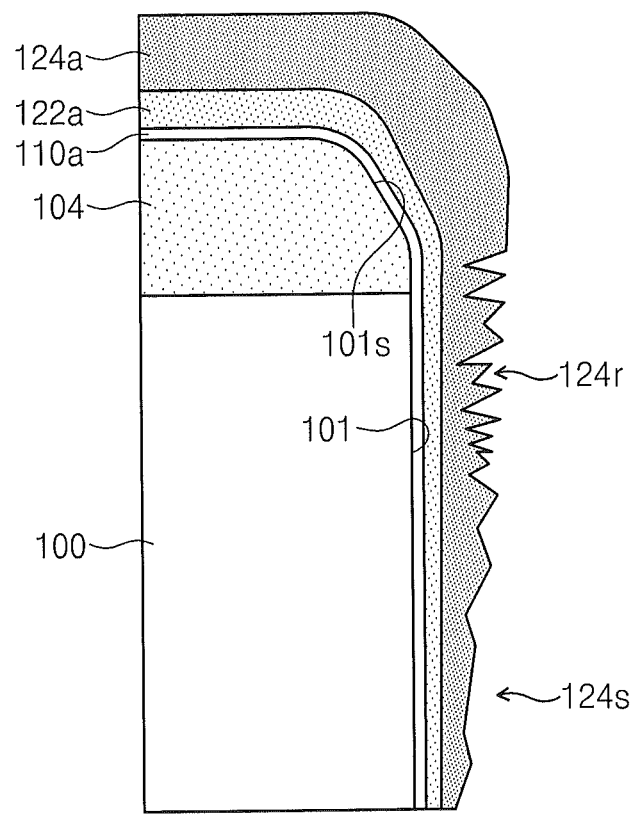

Referring to FIGS. 2B and 2C, the via hole 101 may have a funnel shape whose entrance is relatively wide. For example, if the via hole 101 is formed by a dry etching process, an upper corner of the first interlayer insulation layer 104 may be more etched to form an inclined surface 101s including a downward slope toward the first bottom surface 100b of the substrate 100. Alternatively, the via hole 101 may have a substantially vertical pillar shape.

The seed layer 124a may be formed of Cu or Cu-contained metal (e.g., CuMn) deposited by a physical vapor deposition (PVD) process. The seed layer 124a may be formed to be relatively thick in order to secure a step coverage on sidewall and floor of the via hole 101. For example, when the via hole 101 has the width W of about several μm and the height H of about tens of μm as described in FIG. 2A, the seed layer 124a may have a thickness of about tens to hundreds of nm. Due to the characteristics of the PVD, the seed layer 124a may have an uneven thickness that decreases progressively from the entrance to the floor of the via hole 101. Moreover, the seed layer 124a may have an irregular morphology including a relatively rough surface 124r on an upper part of the via hole 101 and a relatively smooth surface 124s on a lower part of the via hole 101. The surface 124s may be rough to some extent but smoother than the surface 124r. In other words, the seed layer 124a may have the rough surface 124r whose surface roughness is greater than a surface roughness of the smooth surface 124s. It may be understood that, in addition to vertically descending particles to the substrate 100 when the PVD is performed, obliquely descending particles are deposited to form the seed layer 124a having a thick rough upper portion thereof.

Figure 6:
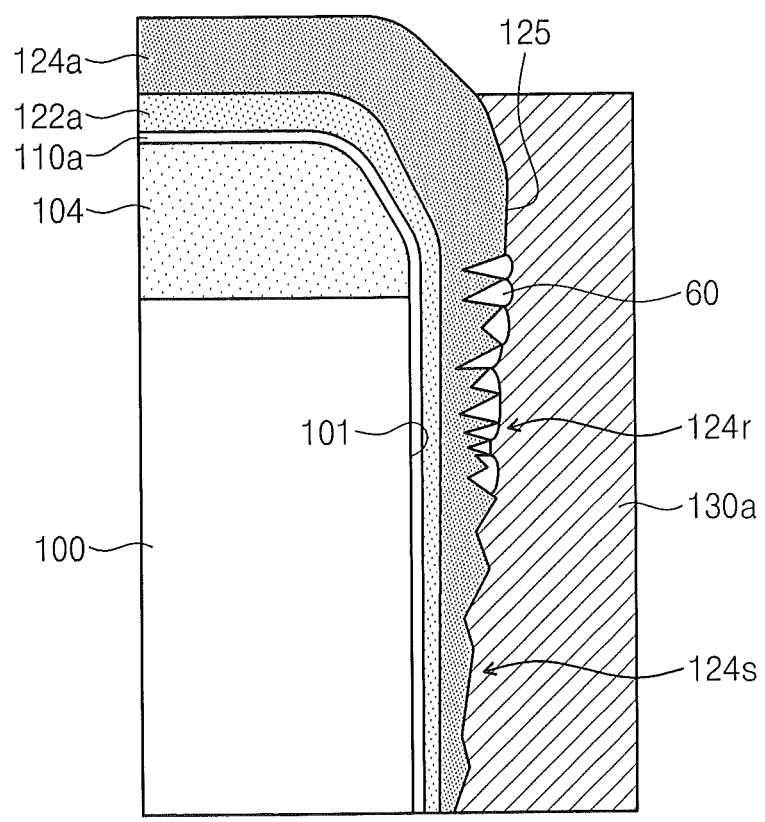
FIG. 6 is a comparative cross sectional view illustrating the creation of voids if the seed layer is not annealed in-situ.

FIG. 6 is a comparative cross sectional view illustrating the creation of voids in an example where the seed layer was not annealed in-situ. As illustrated in FIG. 6, if the conductive layer 130a is formed by an electroplating using the seed layer 124a without the in-situ annealing of the seed layer 124a, the rough surface 124r may be partially filled with metal to create voids 60 at an interface between the conductive layer 130a and the seed layer 124a. The voids 60 may invoke a detachment of the through electrode in a following chemical mechanical polishing or annealing process.

Figure 2D:
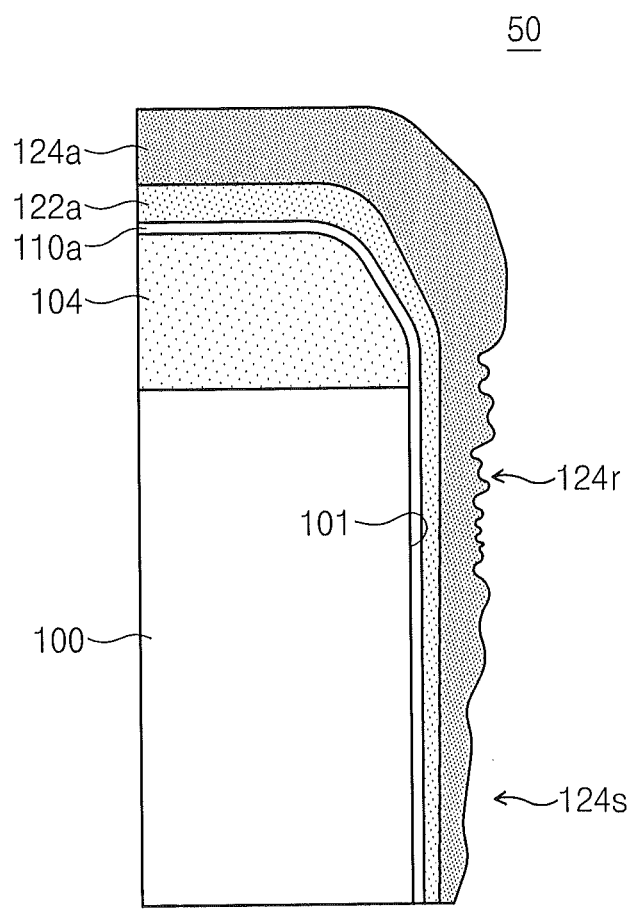

Referring to FIG. 2D, when the seed layer 124a was formed and then annealed in-situ, the surfaces 124r and 124s may become smoother. This in-situ annealing process may make the seed layer 124a reflowed to decrease the roughness of the surfaces 124r and 124s. According to some embodiments, the relatively rough surface 124r may be improved to be smooth. The in-situ annealing process may be performed at a temperature of about 150° C. to about 350° C., or about 150° C. to about 250° C. under a pressure lower than the atmospheric pressure, for example a (high) vacuum state. If the in-situ annealing is performed below the said temperature range, the seed layer 124a may not be sufficiently reflowed. If the in-situ annealing process is performed above the said temperature range, the seed layer 124a may be aggregated. The in-situ annealing process may be performed for about 1 minute to about 20 minutes. After the seed layer 124a is formed, the in-situ annealing process may be performed in a same or different chamber. A state of vacuum may be continuously maintained.

Figure 2E:
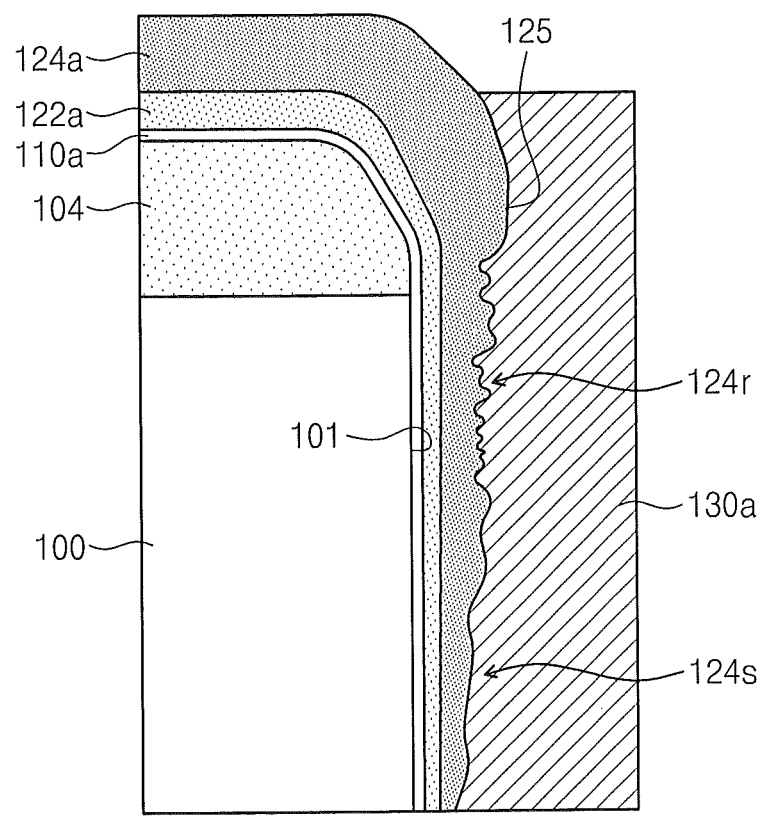
Figure 2F:
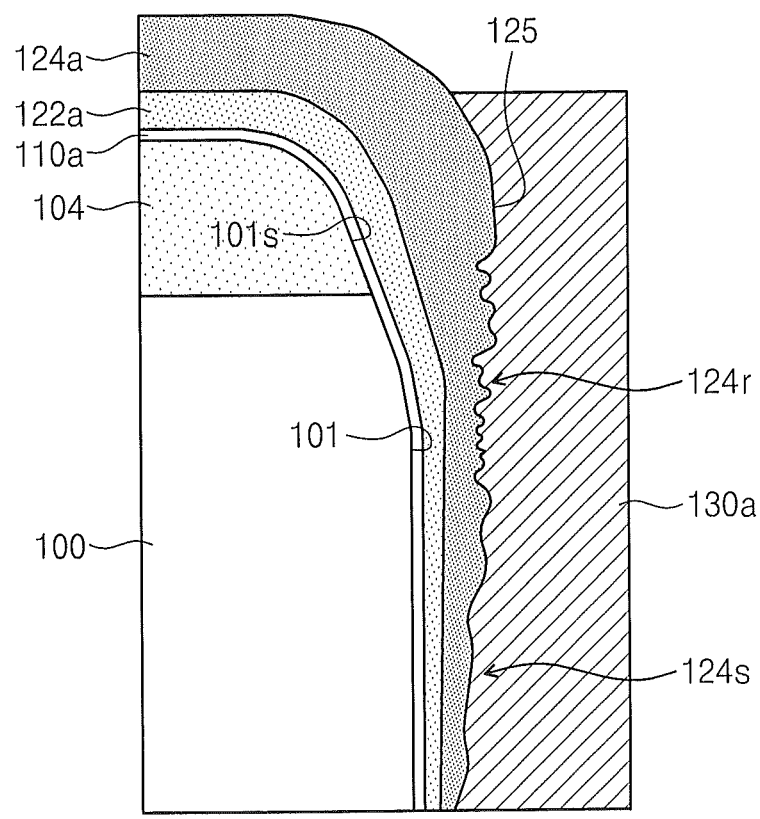

Referring to FIG. 2E, if the conductive layer 130a is electro-plated after the seed layer 124a is annealed in-situ, the surfaces 124r and 124s of the seed layer 124a may be improved to be relatively smoother such that the creation of the voids 60 may be prevented or reduced. Alternatively, as illustrated in FIG. 2F, the inclined surface 101s may extend to an upper portion of the substrate 100 near the first interlayer insulation layer 104.

Figure 2G:
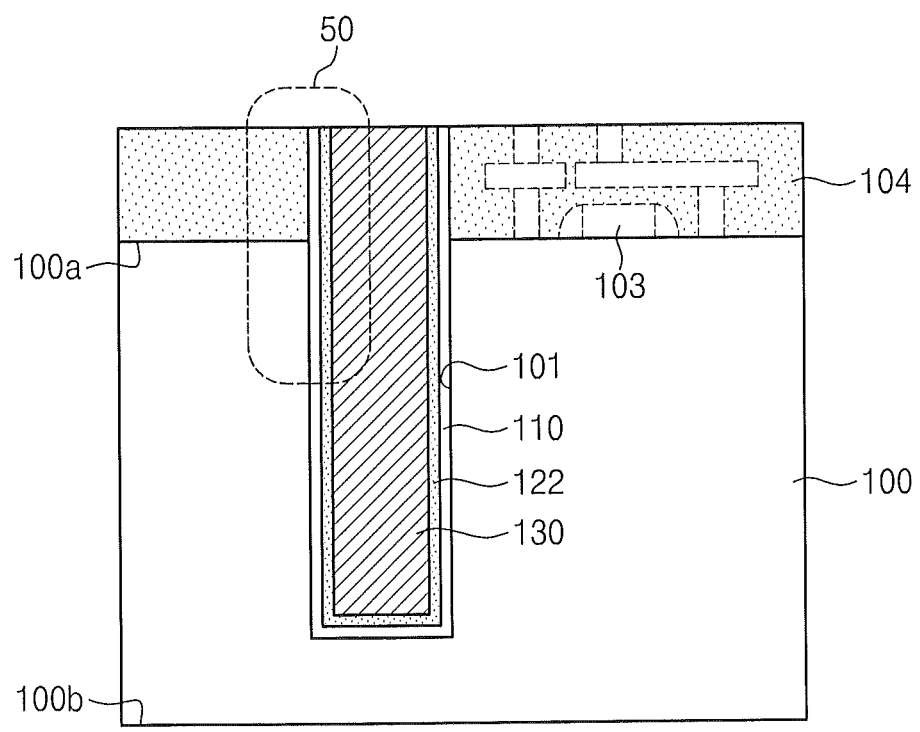

Referring to FIG. 2G, a planarization process may be performed to expose the first interlayer insulation layer 104. The planarization process may include an etch-back or chemical mechanical polishing process. As a result of the planarization process, the conductive layer 130a may be transformed into the pillar shaped through electrode 130 that vertically penetrates the substrate 100 as well as the first interlayer insulation layer 104. In addition, as a result of the planarization process, the insulation layer 110a may be changed into the via isolation layer 110 that electrically insulates the through electrode 130 from the substrate 100. If the metal layer 122a is further formed, the metal layer 122a may be converted into the barrier layer 122 that prevents constituent elements (e.g., copper) of the through electrode 130 from being diffused toward the substrate 100 and/or the integrated circuit 103.

Figure 2H:
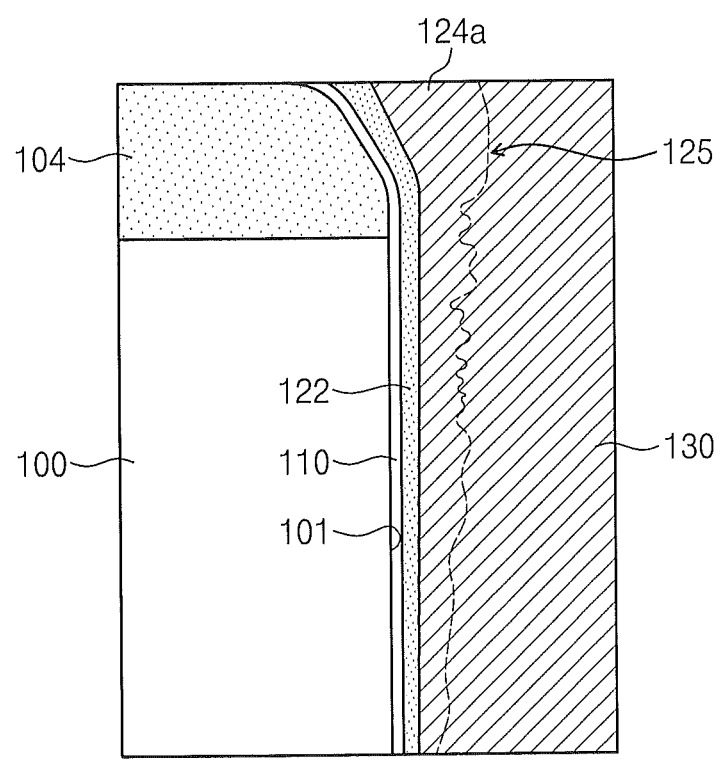

Referring to FIG. 2H, the seed layer 124a may constitute a part of the through electrode 130. If the seed layer 124a comprises metal identical or analogous to that of the through electrode 130, an interface 125 between the seed layer 124a and the through electrode 130 may be invisible. Alternatively, if the seed layer 124a comprises metal different from that of the through electrode 130, the interface 125 may be visible. For example, the interface 125 may have a meandering line shape extending along the via hole 101.

Figure 2I:
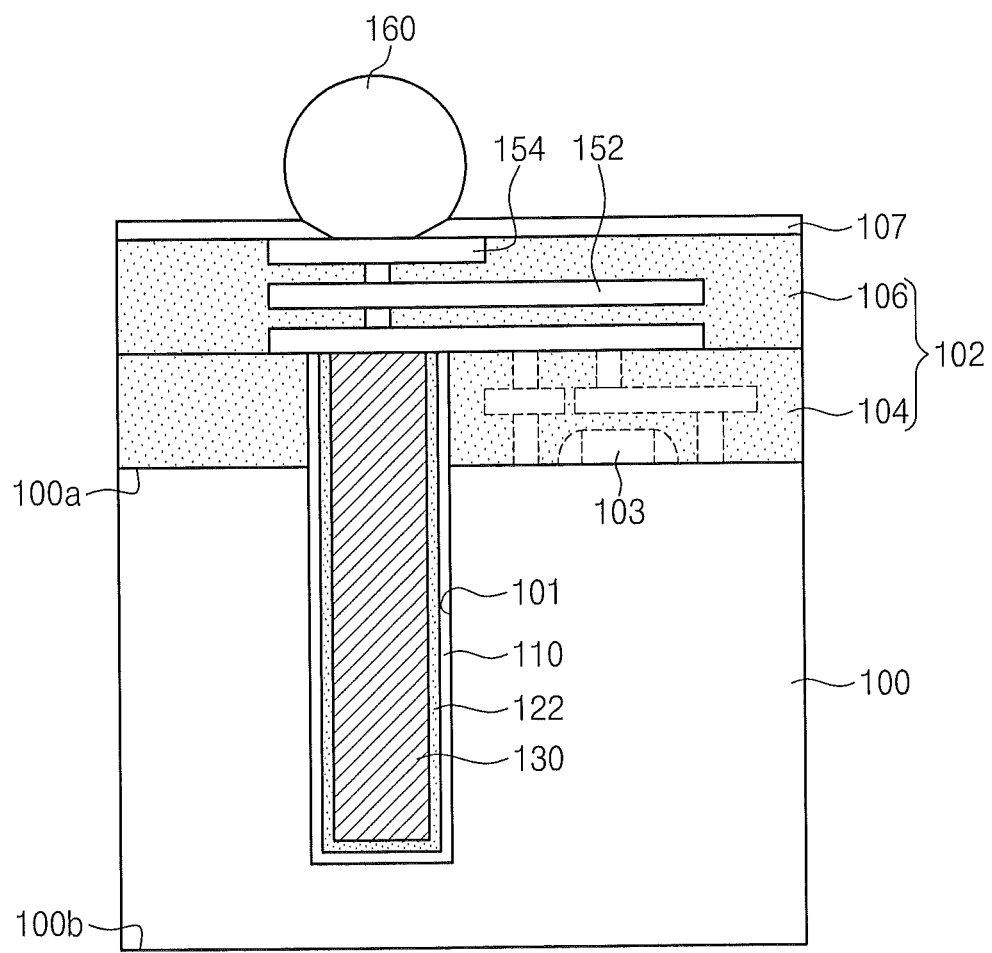

Referring to FIG. 2I, a back-end process may be performed. For example, the metal line 152 of single-layered or multi-layered structure coupled to the through electrode 130, the bonding pad 154 electrically connected to the metal line 152, and a second interlayer insulation layer 106 covering the metal line 152 may be formed on the first interlayer insulation layer 104. The metal line 152 and the bonding pad 154 may be formed by depositing and patterning a metal layer such as a copper layer or aluminum layer. The second interlayer insulation layer 106 may be formed by depositing an insulating material, such as silicon oxide or silicon nitride, identical or analogous to that of the first interlayer insulation layer 104. The upper insulation layer 107 may be formed on the second interlayer insulation layer 106. The upper insulation layer 107 may be formed by depositing and patterning silicon oxide, silicon nitride, or polymer to expose the bonding pad 154. Selectively, a bump process may be further performed to form the upper terminal 160 such as a solder ball or a solder bump coupled to the bonding pad 154. The first and second interlayer insulation layers 106 and 107 may constitute the interlayer insulation layer 102.

Figure 2J:
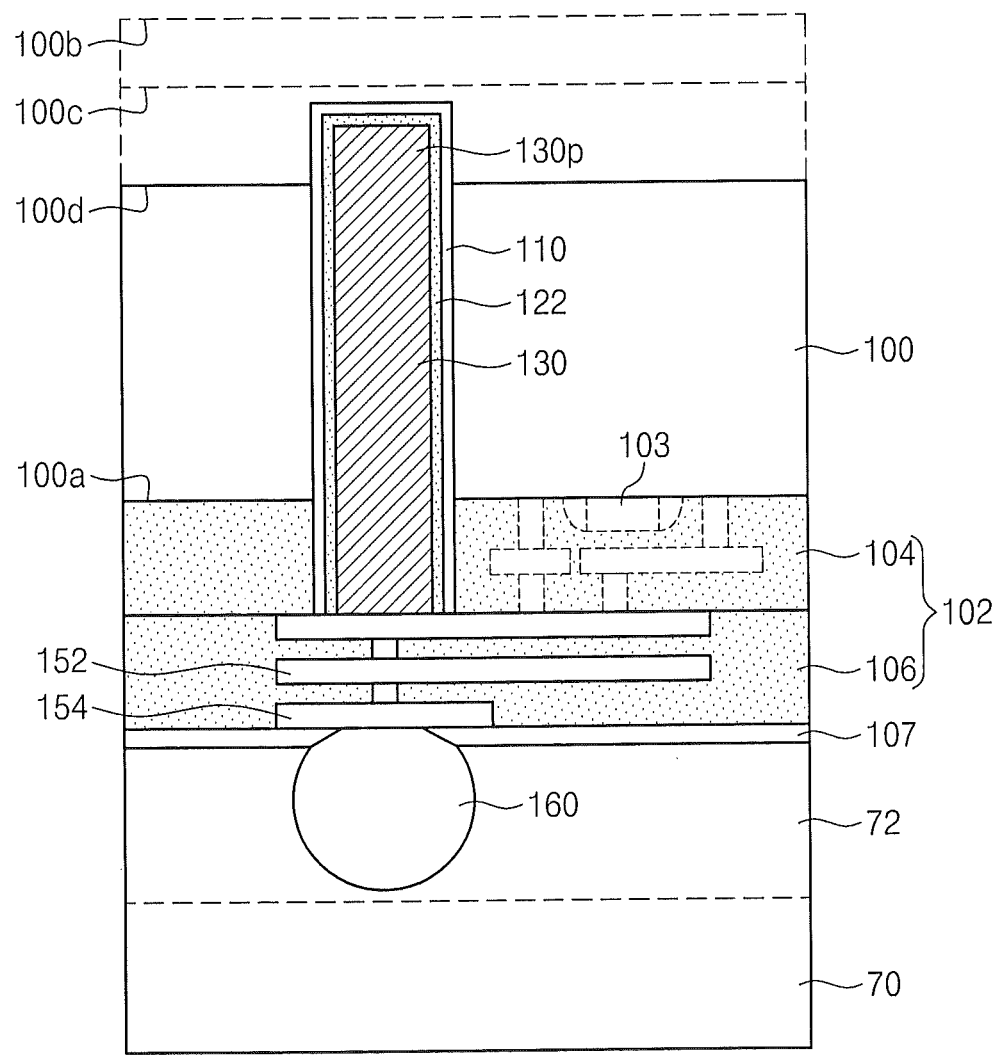

Referring to FIG. 2J, the substrate 100 may be recessed to make the through electrode 130 protrude. For example, the first bottom surface 100b of the substrate 100 may be recessed using at least one of an etching process, a chemical mechanical polishing process, a grinding process, or any combination thereof with an etchant or slurry capable of selectively etching a material (e.g., silicon) of the substrate 100. The recessing process may be performed in such a way that a lowermost portion 130p of the through electrode 130 protrudes from the inactive surface 100d. For example, a chemical mechanical polishing process may be performed on the first bottom surface 100b to expose a second bottom surface 100c through which the through electrode 130 is not exposed, and then a dry etching process may be further performed on the second bottom surface 100c to expose the inactive surface 100d. The protruding process may be performed in a state that a carrier 70 is attached to the active surface 100a of the substrate 100 with an adhesion layer 72 interposed therebetween. The protruding process may be performed in a state that the active surface 100a of the substrate 100 faces upward or downward. In this specification, the active surface 100a may correspond to the active surface and the inactive surface 100d may correspond to the inactive surface.

Figure 2K:
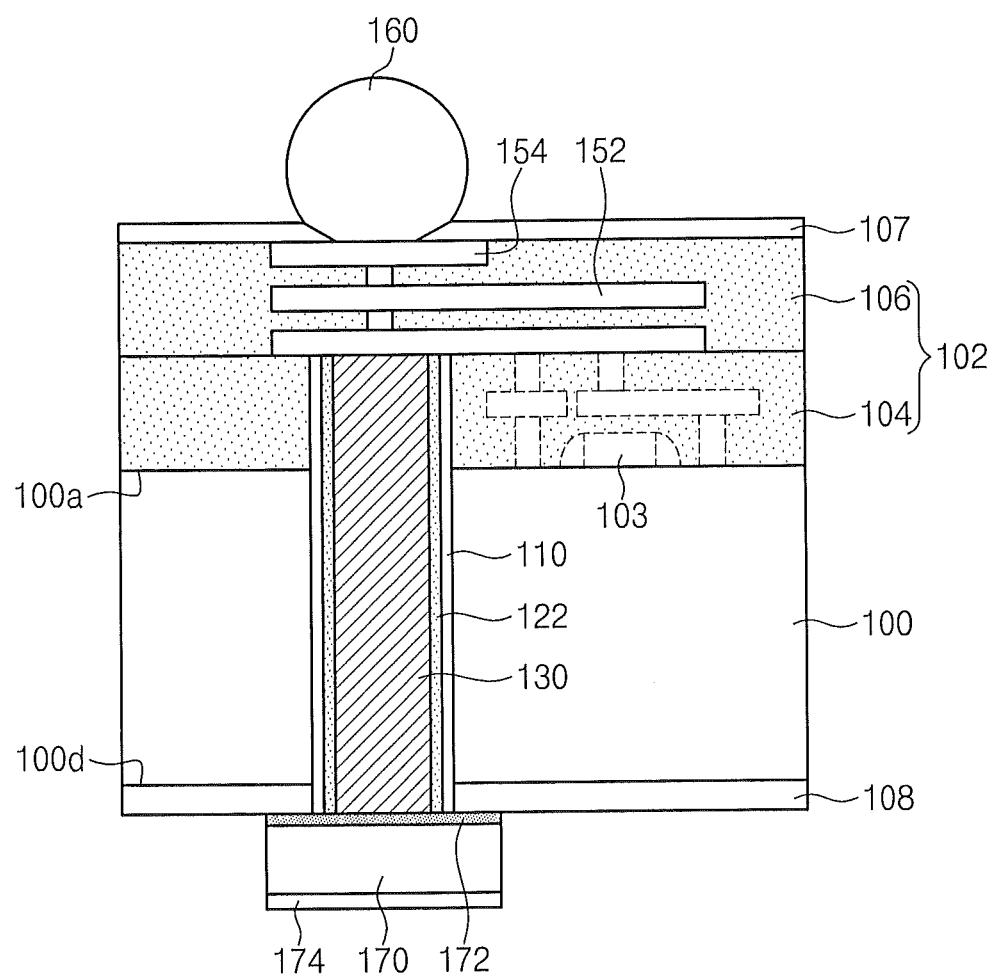

Referring to FIG. 2K, the lower insulation layer 108 may be formed on the inactive surface 100d of the substrate 100. For example, a silicon oxide layer or silicon nitride layer may be deposited on the inactive surface 100d to cover the through electrode 130, and then a chemical mechanical polishing process may be performed to form the planarized lower insulation layer 108. The through electrode 130 may be exposed through the lower insulation layer 108. The lower terminal 170 may be formed on the lower insulation layer 108 to be electrically connected to the through electrode 130. A lower terminal metal layer 172 may be further formed between the lower terminal 170 and the through electrode 130, and a plating layer 174 may be further formed to cover the lower terminal 170. As a result of above described processes, the semiconductor device 1 of FIG. 1 may be fabricated to include an electrical connection 11.

FIGS. 3A to 3D are cross sectional views illustrating a method for fabricating a semiconductor device according to exemplary embodiments of the present inventive concept.

Figure 3A:
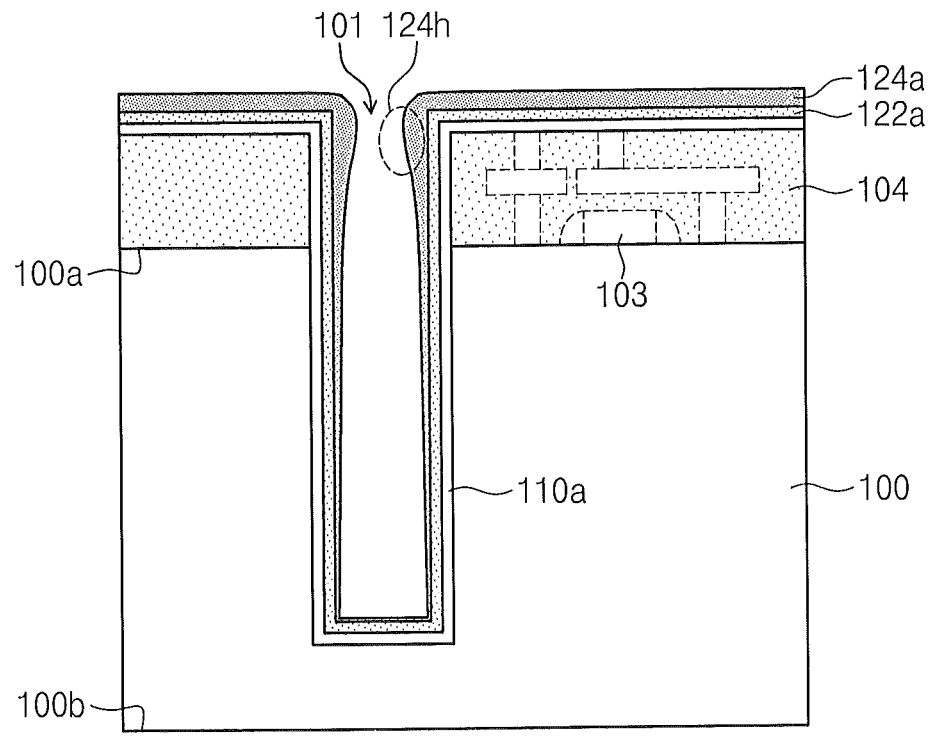
FIGS. 3A to 3D are cross sectional views illustrating a method for fabricating a semiconductor device according to exemplary embodiments of the present inventive concept.

Referring to FIG. 3A, similar or identical to the previous embodiments described with reference to FIGS. 2A and 2B, the via hole 101 may be formed in the substrate 100, the insulation layer 110a may be formed to extend along the inner surface of the via hole 101, and the seed layer 124a may be formed on the insulation layer 110a using a physical vapor deposition process. The metal layer 122a may be further formed between the insulation layer 110a and the seed layer 124a. The seed layer 124a may be formed to have an uneven profile including an overhang 124h. An example is shown in FIG. 3B which is an enlarged view of a portion of FIG. 3A.

Figure 3B:
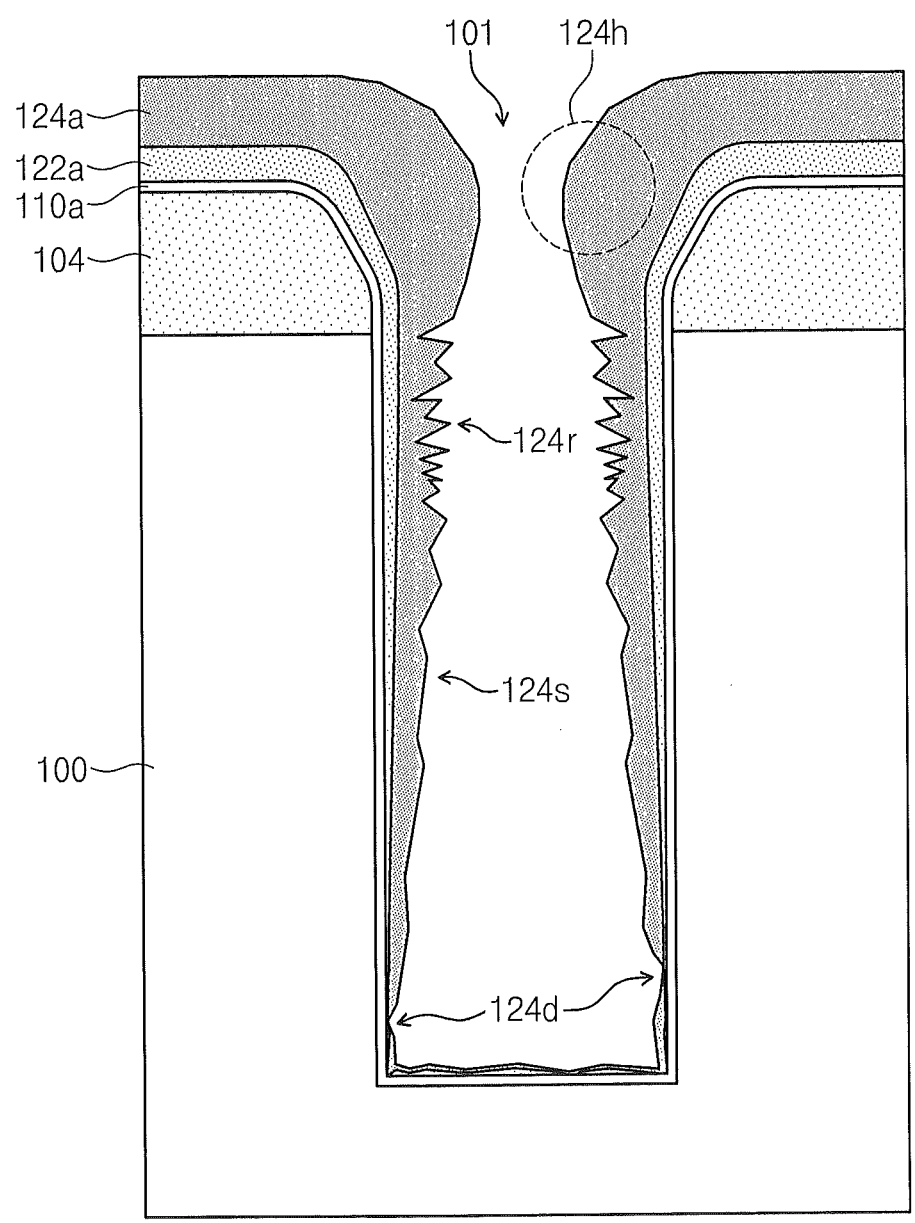

Referring to FIG. 3B, the seed layer 124a may have the overhang 124h, which is created by a characteristics of the physical vapor deposition, on an upper portion of the via hole 101 and a cut 124d, which is caused by an incomplete or no deposition of metal, on a lower portion of the via hole 101. As shown in FIG. 2B, the seed layer 124a may have the uneven thickness, that decreases progressively from the entrance to the floor of the via hole 101, and the irregular morphology, including the relatively rough surface 124r on the upper part of the via hole 101 and the relatively smooth surface 124s on the lower part of the via hole 101.

Figure 7:
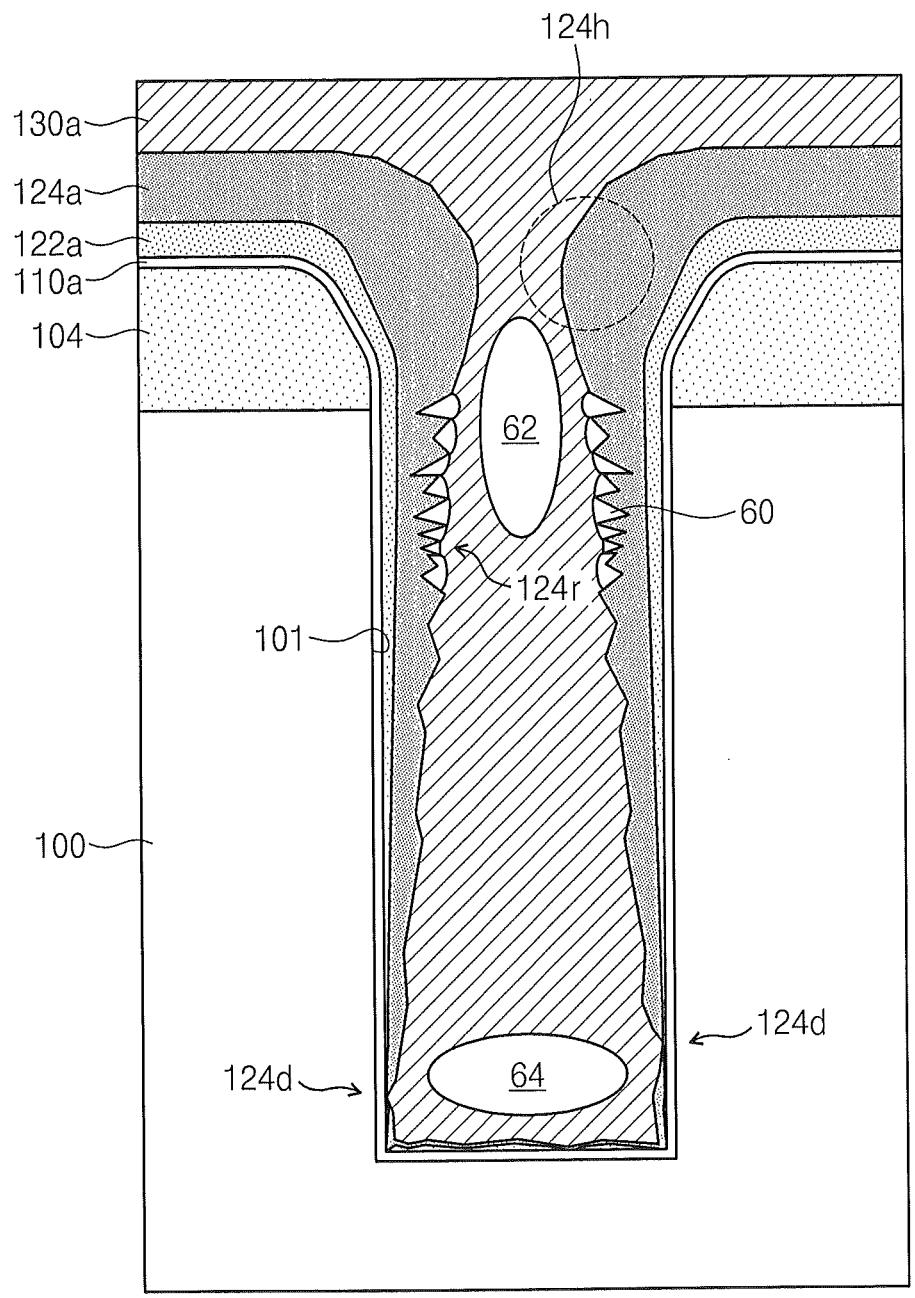
FIG. 7 is a comparative cross sectional view illustrating the creation of voids if the seed layer is not annealed in-situ.

FIG. 7 is a comparative cross sectional view illustrating the creation of voids in an example where the seed layer was not annealed in-situ. As illustrated in FIG. 7, if the conductive layer 130a is formed by an electroplating process using the seed layer 124a without the in-situ annealing of the seed layer 124a, the conductive layer 130a may have at least one void 62 created by a pinch-off (or the via hole's entrance closing) due to the overhang 124h and at least one void 64 generated by the cut 124d due to an incomplete or no deposition of metal. Likewise, as shown in FIG. 6, the rough surface 124r may be partially filled with metal to form the voids 60.

Figure 3C:
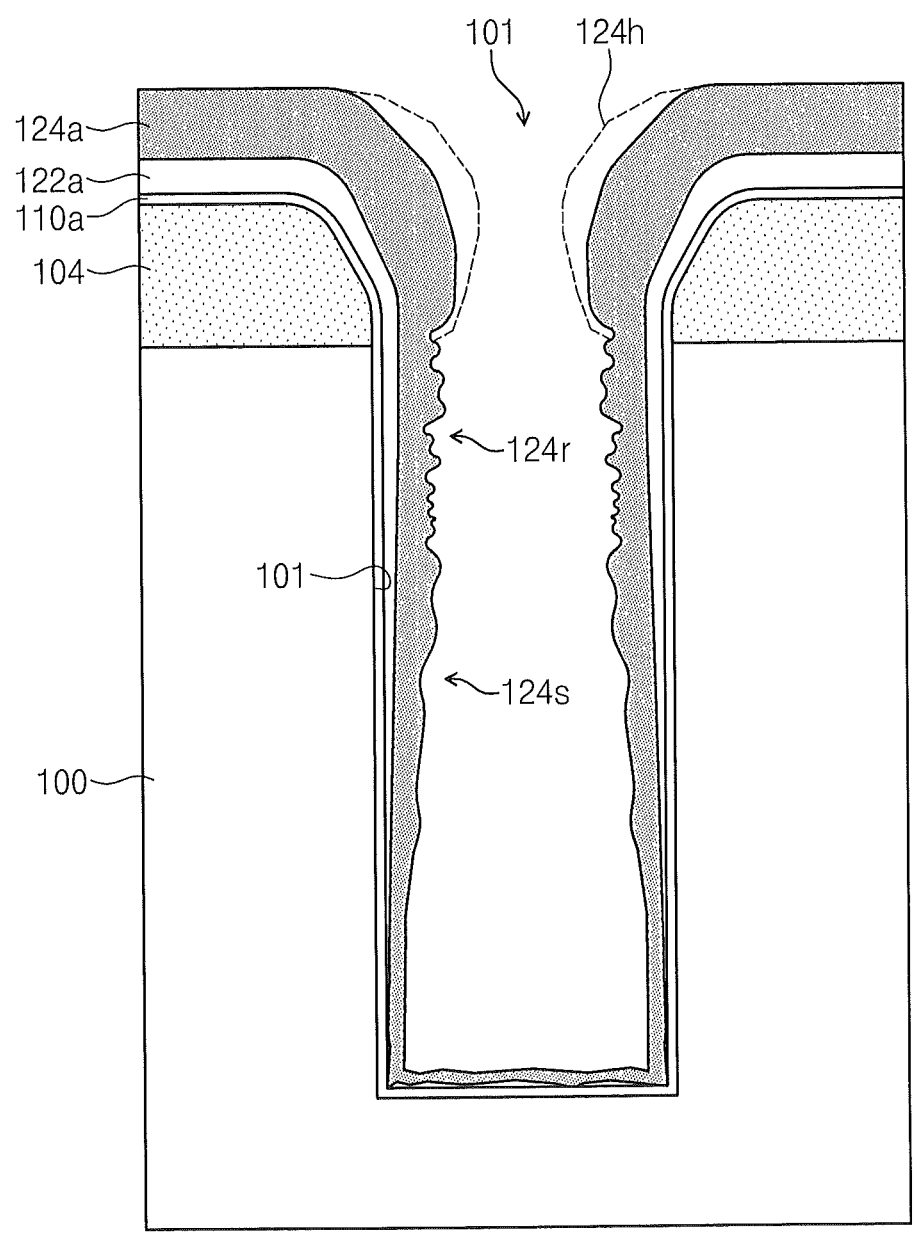

Referring to FIG. 3C, according to some embodiments, the seed layer 124a may be formed and then annealed in-situ. The in-situ annealing may make the seed layer 124a reflowed to remove or reduce the overhang 124h and/or the cut 124d, which may provide the seed layer 124a with an improved profile or step coverage. Moreover, the reflow may make the surfaces 124r and 124s smoother. The in-situ annealing may be performed under a condition identical or analogous to that as described in FIG. 2F.

Figure 3D:
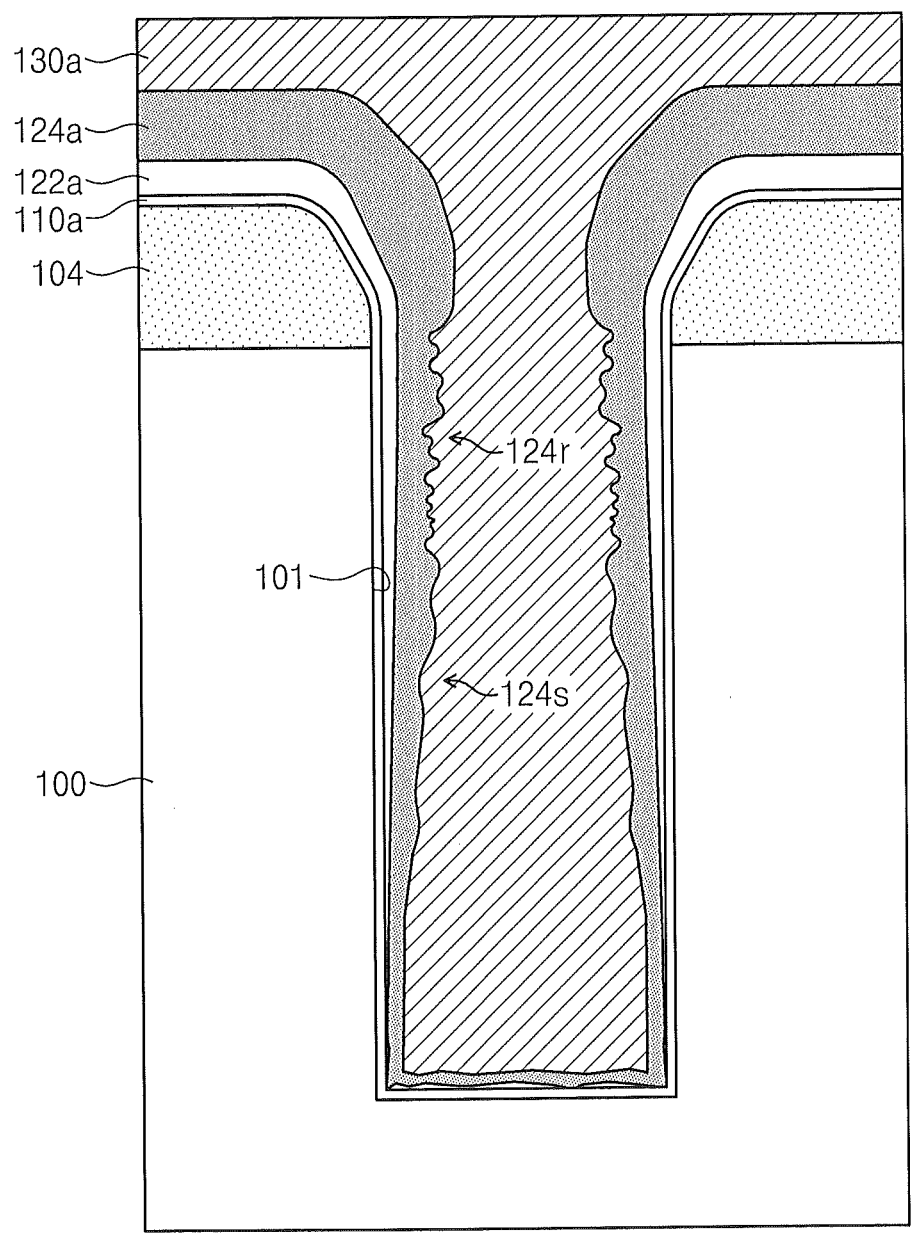

Referring to FIG. 3D, after the in-situ annealing of the seed layer 124a, an electroplating process may be performed to form the conductive layer 130a. The conductive layer 130a may have no voids or fewer voids due the improvement of the profile or step coverage of the seed layer 124a. Similar or identical to the previous embodiments described with reference to FIGS. 2G and 2K, the semiconductor device 1 of FIG. 1 may be fabricated to include an electrical connection 11.

Figure 4A:
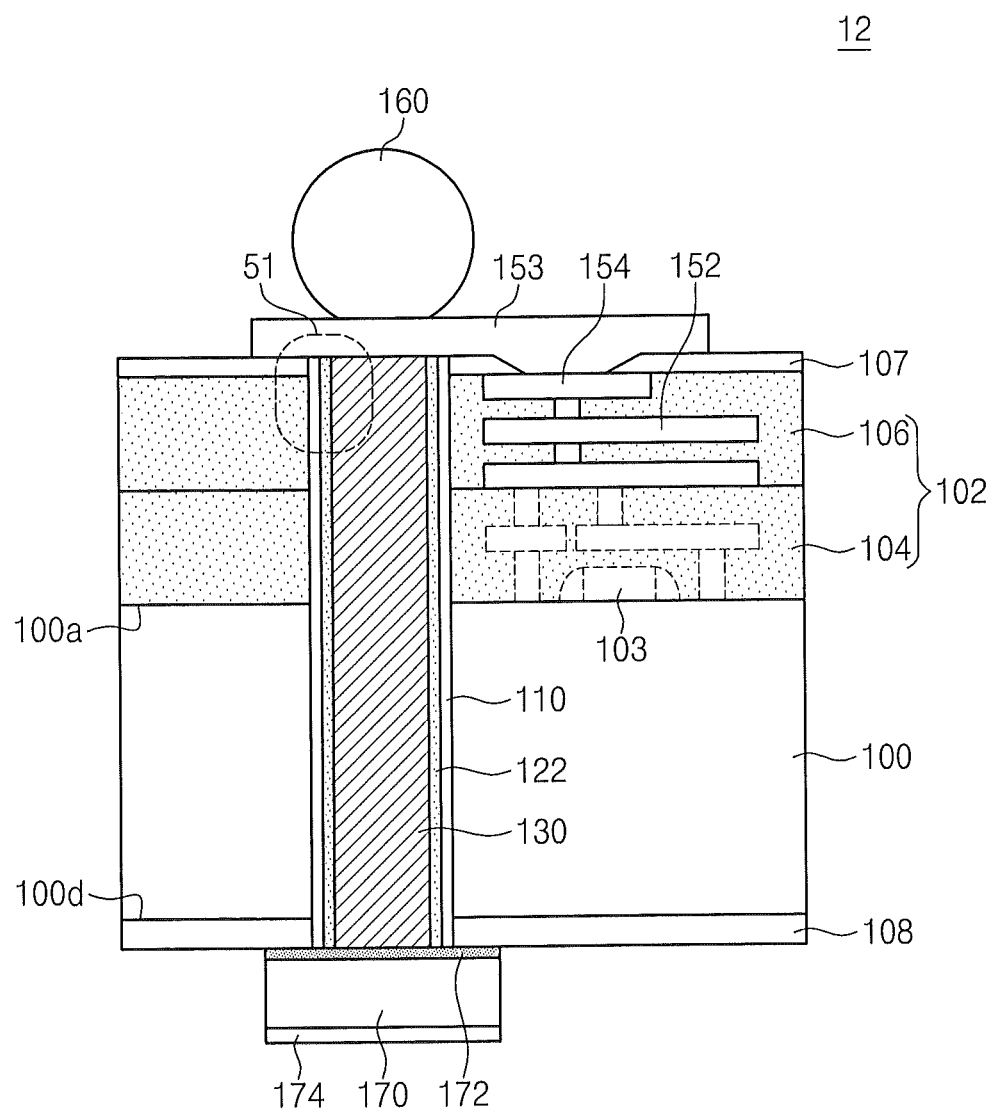
FIGS. 4A to 4C are modified examples of FIG. 2K according to alternate exemplary embodiments of the present inventive concept.
Figure 4B:
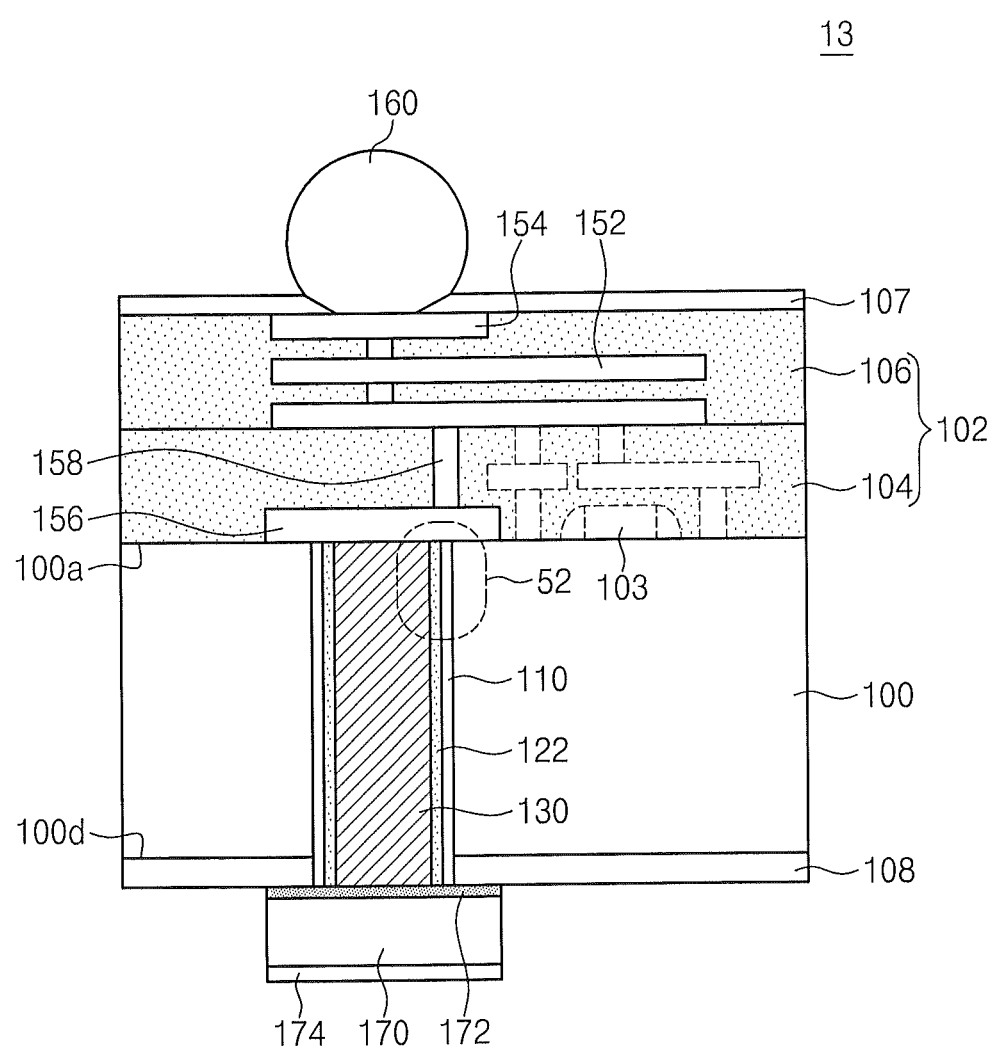
Figure 4C:
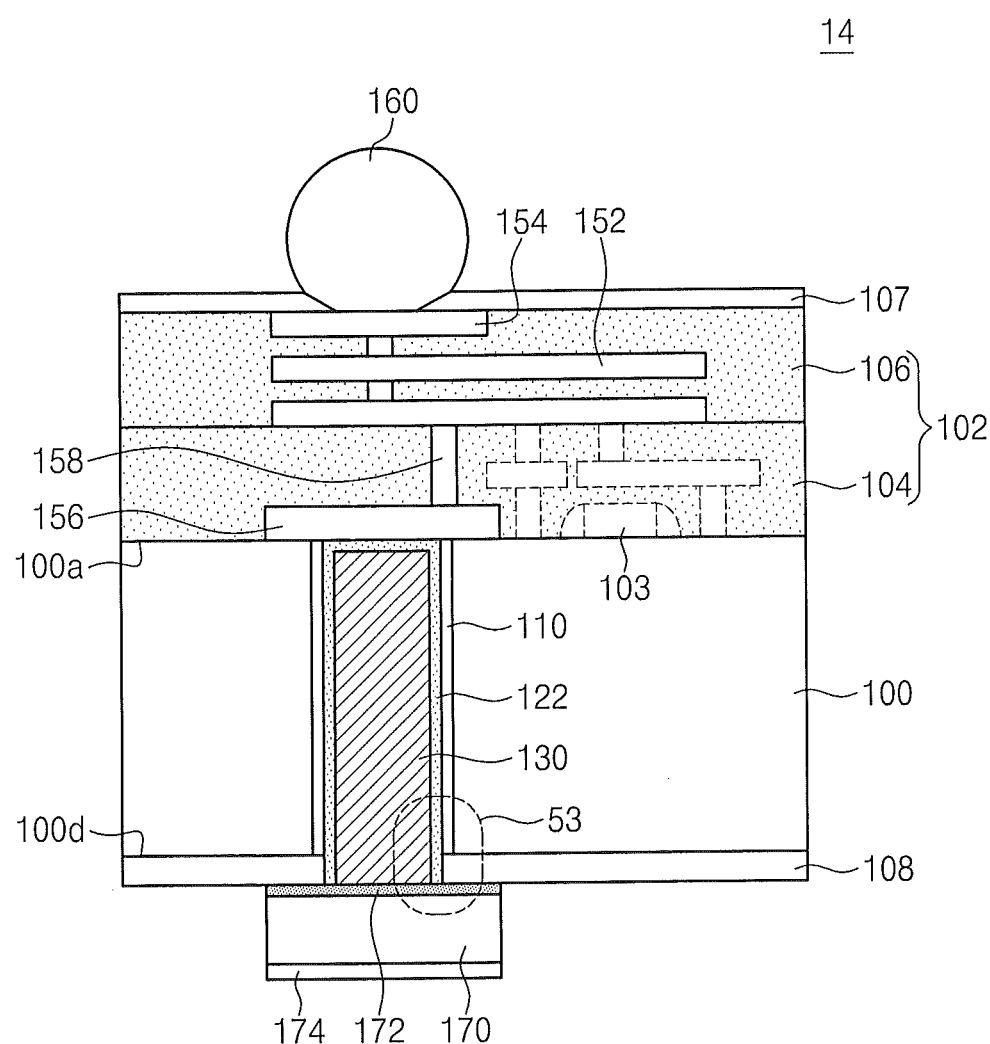

FIGS. 4A to 4C are modified examples of FIG. 2K.

Referring to FIG. 4A, an electrical connection 12 may comprise the through electrode 130, which may be formed after the formation of the integrated circuit 103 and the metal line 152. The through electrode 130 may have a pillar shape that penetrates the interlayer insulation layer 102 and the substrate 100. An upper line 153 may be further provided on the upper insulation layer 107 to electrically connect the through electrode 130 with the bonding pad 154. The through electrode 130 may further penetrate the upper insulation layer 107 to be electrically connected to the upper line 153. A portion 51 near an uppermost part of the through electrode 130 may have a structure identical or analogous to that as illustrated in FIG. 2H.

Referring to FIG. 4B, an electrical connection 13 may comprise the through electrode 130, which may be formed before the formation of the integrated circuit 103 and the metal line 152. An interconnection line 156, insulated from the substrate 100 and electrically connected with the through electrode 130, may be further provided on the active surface 100a of the substrate 100. The through electrode 130 may have a pillar shape that penetrates the substrate 100 and be electrically connected to the metal line 152 and/or integrated circuit 103 by way of a via 158 connecting the interconnection line 156 with the metal line 152. A portion 52 near an uppermost part of the through electrode 130 may have a structure identical or analogous to that as illustrated in FIG. 2H.

Referring to FIG. 4C, an electrical connection 14 may comprise the through electrode 130, which may be formed after the formation of the integrated circuit 103 and the metal line 152 and further after the recess of the substrate 100. The barrier layer 122 may have a cup shape whose top portion contacted with the interconnection line 156 is closed and whose bottom portion coupled to the lower terminal 170 is open. A portion 53 near a lowermost part of the through electrode 130 may have a structure identical or analogous to that as illustrated in FIG. 2H.

Figure 5A:
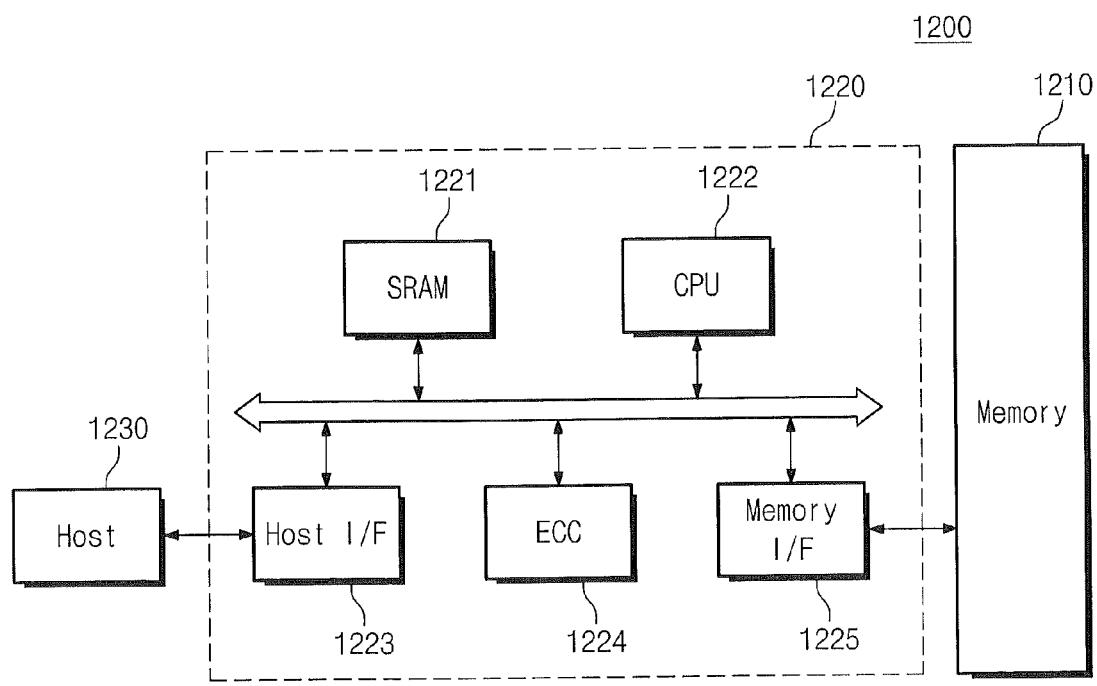
FIG. 5A is a schematic block diagram illustrating an example of memory cards including a semiconductor device according to exemplary embodiments of the present inventive concept.
Figure 5B:
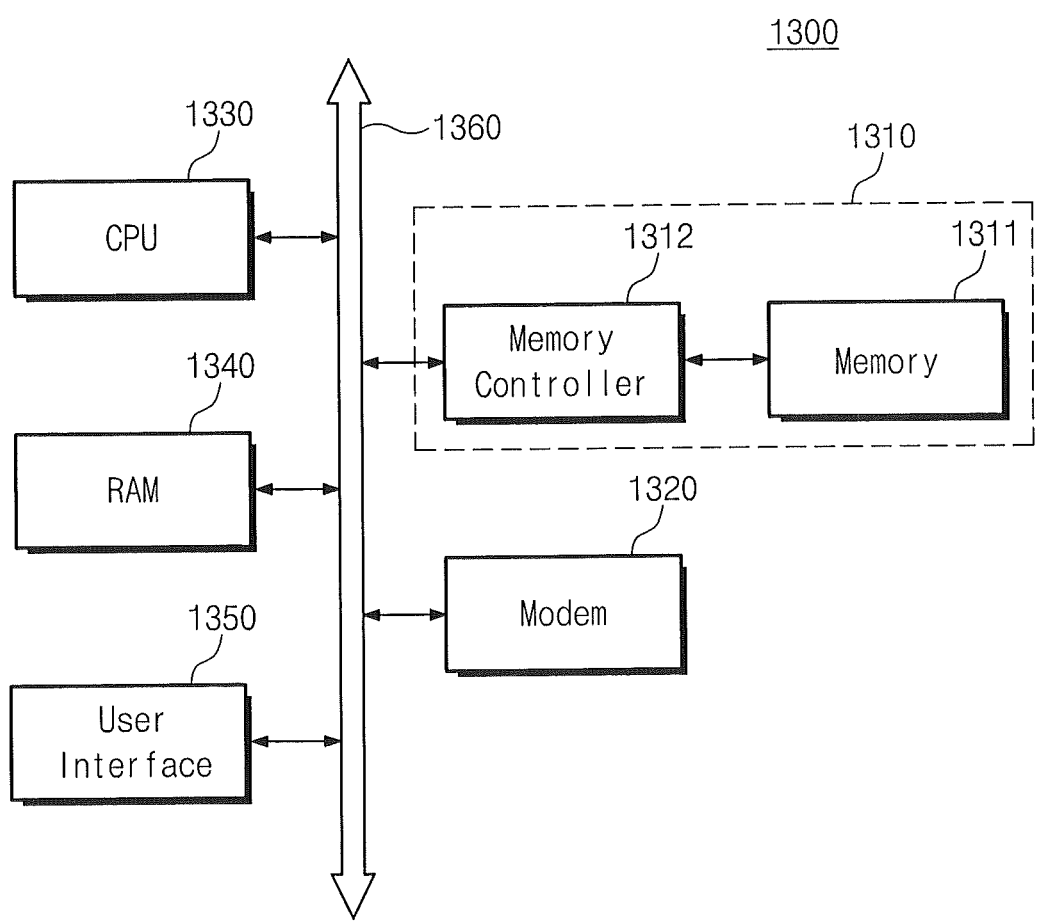
FIG. 5B is a schematic block diagram illustrating an example of information process system including a semiconductor device according to exemplary embodiments of the present inventive concept.

FIG. 5A is a schematic block diagram illustrating an example of memory cards including a semiconductor device according to exemplary embodiments of the present inventive concept. FIG. 5B is a schematic block diagram illustrating an example of information process system including a semiconductor device according to exemplary embodiments of the present inventive concept.

Referring to FIG. 5A, a semiconductor memory 1210 including the semiconductor device 1 according to exemplary embodiments of the inventive concept is applicable to a memory card 1200. For example, the memory card 1200 may include a memory controller 1220 generally controlling data exchange between a host 1230 and the semiconductor memory 1210. An SRAM 1221 is used as a work memory of a processing unit 1222. A host interface 1223 has a data exchange protocol of the host 1230 connected to the memory card 1200. An error correction coding block 1224 detects and corrects errors of data that are read from the semiconductor memory 1210. A memory interface 1225 interfaces the semiconductor memory 1210 according to the example embodiments. The processing unit 1222 generally controls data exchange of the memory controller 1220.

Referring to FIG. 5B, an information processing system 1300 may include a memory system 1310 having the semiconductor device 1 according exemplary embodiments of the inventive concept. The information processing system 1300 may be a mobile device or a computer. For example, the information processing system 1300 may include a modem 1320, a central processing unit 1330, a RAM 1340, and a user interface 1350 electrically connected to the memory system 1310 via a system bus 1360. The memory system 1310 may include a memory 1311 and a memory controller 1312 and have substantially the same configuration as that of the memory card 1200 in FIG. 5A. The memory system 1310 stores data processed by the central processing unit 1330 or data input from the outside. The information processing system 1300 may be provided as a memory card, a solid state disk, a semiconductor device disk, a camera image sensor, and other application chipsets. In some embodiments, the memory system 1310 may be used as a portion of a solid state drive (SSD), and in this case the information processing system 1300 may stably and reliably store a large amount of data in the memory system 1310.

Although the present invention has been described in connection with the embodiments of the present invention illustrated in the accompanying drawings, it is not limited thereto. It will be apparent to those skilled in the art that various substitutions, modifications and changes may be thereto without departing from the scope and spirit of the present inventive concept as defined by the following claims.

What is claimed is:

1. A method for fabricating a semiconductor device having a through electrode, the method comprising:
    forming a via hole which opens towards an upper surface of a substrate and does not penetrate a lower surface of the substrate;
    forming a via isolation layer which extends along an inner surface of the via hole and covers the upper surface of the substrate;
    forming a seed layer on the via isolation layer which extends along the via isolation layer, the seed layer having an uneven thickness and an irregular surface roughness along a sidewall of the via hole, the sidewall extending substantially perpendicular to the upper surface of the substrate;
    annealing the seed layer in-situ at a temperature of about 150° C. to 350° C. after forming the seed layer, under a pressure less than an atmospheric pressure without a vacuum break relative to forming the seed layer;
    forming a conductive layer which fills the via hole by an electroplating process using the seed layer; and
    planarizing the upper surface of the substrate to form the through electrode surrounded by the via isolation layer in the via hole,
    wherein a first portion of the seed layer comprises a plurality of deviations in thickness from an average thickness of the first portion of the seed layer that are larger than a plurality of deviations in thickness of a second portion of the seed layer from an average thickness of the second portion of the seed layer,
    wherein the first portion of the seed layer extends substantially perpendicular to the upper surface of the substrate along a first portion of the sidewall of the via hole,
    wherein the second portion of the seed layer extends substantially perpendicular to the upper surface of the substrate along a second portion of the sidewall of the via hole,
    wherein forming the seed layer comprises performing a physical vapor deposition to form a metal layer having an uneven thickness on the via isolation layer,
    wherein the seed layer has a first thickness at an entrance of the via hole adjacent to the upper surface of the substrate and a second thickness less than the first thickness at a floor of the via hole adjacent to the lower surface of the substrate,
    wherein the first thickness is measured along the first portion of the seed layer that extends substantially perpendicular to the upper surface of the substrate along the first portion of the sidewall of the via hole, and wherein the second thickness is measured along the second portion of the seed layer that extends substantially perpendicular to the upper surface of the substrate along the second portion of the sidewall of the via hole.

2. The method of claim 1, wherein the first thickness has a first surface roughness and the second thickness has a second surface roughness less than the first surface roughness.

3. The method of claim 2, wherein annealing the seed layer in-situ comprises reflowing the seed layer to reduce at least one of the first surface roughness and the second surface roughness.

4. The method of claim 2,
wherein the seed layer comprises an overhang at the entrance of the via hole adjacent to the upper surface of the substrate, and
wherein annealing the seed layer in-situ comprises reflowing the seed layer to reduce or remove the overhang.

5. The method of claim 2,
wherein the seed layer defines a cut portion that does not include the seed layer within the second portion of the seed layer, and
wherein annealing the seed layer in-situ comprises reflowing the seed layer to reduce or remove the cut portion.

6. The method of claim 1, further comprising:
recessing the lower surface of the substrate to allow the through electrode to protrude;
forming a lower insulation layer covering the through electrode on the recessed lower surface of the substrate;
planarizing the lower insulation layer to expose the through electrode; and
forming a lower terminal on the lower insulation layer which is electrically connected to the through electrode, the lower terminal comprising a lower terminal metal layer between the lower terminal and the through electrode and a plating layer covering portions of the lower terminal.

7. A method for fabricating a semiconductor device having a through electrode, the method comprising:
providing a substrate having an upper surface and a lower surface opposite to the upper surface;
forming a via hole which partially penetrates the substrate and opens towards the upper surface of the substrate;
forming a via isolation layer covering an inner surface of the via hole;
forming a metal layer covering the via isolation layer by a physical vapor deposition, wherein the metal layer has a first surface along a first portion of at sidewall of the via hole at an entrance of the via hole adjacent to the upper surface of the substrate and a second surface smoother than the first surface along a second portion of the sidewall of the via hole at a floor of the via hole adjacent to the lower surface of the substrate;
annealing the metal layer in-situ; and
forming the through electrode filling the via hole by an electroplating using the metal layer,
wherein the first surface of the metal layer comprises a plurality of deviations in thickness from an average thickness of the first surface of the metal layer that are larger than a plurality of deviations in thickness of the second surface of the metal layer from an average thickness of the second surface of the metal layer, wherein the first surface of the metal layer extends substantially perpendicular to the upper surface of the substrate along the first portion of the sidewall of the via hole,
wherein the second surface of the metal layer extends substantially perpendicular to the upper surface of the substrate along the second portion of the sidewall of the via hole, and
wherein a portion of the metal layer having the first surface has a first thickness and another portion of the metal layer having the second surface has a second thickness less than the first thickness.

8. The method of claim 7, wherein the metal layer comprises copper, and wherein the in-situ annealing is performed at a temperature of about 150° C. to 350° C.

9. The method of claim 8, wherein the in-situ annealing is performed under a pressure less than an atmospheric pressure.

10. The method of claim 7, wherein forming the via hole comprises performing a dry etching process on the substrate to form a hole partially penetrating the substrate,
wherein the entrance of the via hole has an inclined surface including a downward slope toward the lower surface of the substrate,
wherein the inclined surface of the via hole forms a funnel shape wherein the entrance of the via hole is substantially wider than a lower portion of the via hole that extends substantially perpendicular to the upper surface of the substrate.

11. A method of fabricating a semiconductor device having a through electrode, comprising:
forming a via hole partially penetrating a substrate wherein an entrance of the via hole is on a top surface of the substrate;
forming an insulation layer to cover an inner surface of the via hole;
forming a seed layer using a physical vapor deposition (PVD) process to cover the insulation layer, the seed layer having an uneven thickness and an irregular surface roughness along a sidewall of the via hole, the sidewall extending substantially perpendicular to the top surface of the substrate;
annealing the seed layer in-situ at a temperature of about 150° C. to 350° C. and under a pressure less than an atmospheric pressure without a vacuum break relative to forming the seed layer;
forming the through electrode to fill the via hole provided with the insulation layer and seed layer; and
recessing a bottom surface of the substrate to expose the through electrode,
wherein a first portion of the seed layer comprises a plurality of deviations in thickness from an average thickness of the first portion of the seed layer that are larger than a plurality of deviations in thickness of a second portion of the seed layer from an average thickness of the second portion of the seed layer,
wherein the first portion of the seed layer extends substantially perpendicular to the top surface of the substrate along a first portion of the sidewall of the via hole,
wherein the second portion of the seed layer extends substantially perpendicular to the to surface of the substrate along a second portion of the sidewall of the via hole,
wherein the seed layer has a first thickness at an entrance of the via hole adjacent to the top surface of the substrate and a second thickness less than the first thickness at a floor of the via hole adjacent to the bottom surface of the substrate, wherein the first thickness is measured along the first portion of the seed layer that extends substantially perpendicular to the top surface of the substrate along the first portion of the sidewall of the via hole, and wherein the second thickness is measured along the second portion of the seed layer that extends substantially perpendicular to the top surface of the substrate along the second portion of the sidewall of the via hole.

12. The method of claim 11, further comprising:
forming a metal layer to cover the insulation layer, wherein the seed layer covers the metal layer.

13. The method of claim 11, wherein the annealing is performed at a temperature which is high enough to reflow the seed layer but low enough that the seed layer is not aggregated.

14. The method of claim 11,
wherein the seed layer comprises copper,
wherein the temperature of the annealing is about 150° C. to 250° C., and
wherein the annealing is performed for a duration of about 1 to 20 minutes.

15. The method of claim 11, wherein the through electrode is electrically attached to an integrated circuit on the top surface of the substrate and electrically connected to a lower terminal on the bottom surface of the substrate,
wherein the lower terminal comprises a lower terminal metal layer between the lower terminal and a lower insulation layer and a plating layer covering a portion of the lower terminal.

* * * * *